United States Patent [19]
Kao et al.

[11] Patent Number: 5,561,102
[45] Date of Patent: Oct. 1, 1996

[54] INTER-HALOGEN-DOPED SUPERCONDUCTIVE FULLERENES

[75] Inventors: Yi-Han Kao, Williamsville; Liwei Song, Buffalo; Deborah D. L. Chung, East Amherst; Kevin T. Fredette, Baldwinsville, all of N.Y.

[73] Assignee: The Research Foundation of State University of New York at Buffalo, Buffalo, N.Y.

[21] Appl. No.: 355,851

[22] Filed: Dec. 14, 1994

Related U.S. Application Data

[62] Division of Ser. No. 8,213, Jan. 25, 1993, Pat. No. 5,380,703.

[51] Int. Cl.$^6$ .............................. H01B 1/04; C07B 39/00
[52] U.S. Cl. .................. 505/123; 505/460; 505/461; 505/775; 252/500; 252/502; 252/518; 423/414; 423/439; 423/460; 423/DIG. 39; 423/DIG. 40
[58] Field of Search ................................ 505/100, 123, 505/460, 461, 775; 252/500, 502, 518; 423/414, 439, 460, DIG. 39, DIG. 40

[56] References Cited

U.S. PATENT DOCUMENTS

| | | | |
|---|---|---|---|
| 5,156,003 | 10/1992 | Yoshiro et al. | 62/3.1 |
| 5,223,479 | 6/1993 | McCauley, Jr. et al. | 505/1 |
| 5,273,778 | 12/1993 | Yoshimoto et al. | 427/122 |

FOREIGN PATENT DOCUMENTS

WO92/04279   3/1992   WIPO.

OTHER PUBLICATIONS

Hadden et al., "Conductive Films of $C_{60}$ and $C_{70}$ by Alkali-Metal Doping," *Nature*, 350(6316):320–322 (Mar. 1991).
Hebard, "Superconductivity in Doped Fullerenes," *Physics Today*, pp. 26–32, Nov. 1992.
Curl et al., "Fullerenes," *Scientific American*, pp. 54–63, Oct. 1991.
Huffman, "Solid $C_{60}$," *Physics Today*, pp. 22–29, Nov. 1992.
Holloway et al., "Fluorination of Buckminsterfullerene," *J. Chem. Soc., Chem. Commun.*, pp. 966–969, 1991.
Zhu et al., "Intercalation of Solid $C_{60}$ with Iodine," *Nature*, 355:712–714 (Feb. 20, 1992).
Olah et al., "Chlorination and Bromination of Fullerenes. Nucleophilic Methoxylation of Polychlorofullerenes and their Aluminum Trichloride Catalyzed Friedal–Crafts Reaction with Aromatics to Polyaryl Fullerenes," *J. Amer. Chem. Soc.*, 113:9385–87 (1991).
Tanigaki et al., "Superconductivity at 33 K in $Cs_xRb_yC_{60}$," *Nature*, 352:222–223 (1991).
"Fullerenes Heat Up," *Nature*, 352:463 (1991).
Dresselhaus et al., "Intercalation Compounds of Graphite," *Advances in Physics*, 30:139–326 (1981).
Swinbanks, "Fullerenes Warm Up," *Natures*, 352:749 (1991).
Ohno et al., "Doping of C60 with Iodine," *Nature*, 355:401 (Jan. 30, 1992).
Swinbanks, "Fullerene False Alarm," *Nature*, 353:377 (1991).
Sekine et al., "Magnetic Behavior and Structure of the Halogen–doped Fullerene $C_{60}$," *J. App. Phys.*, 72(11):5448–50 (Dec. 1, 1992).
Wang et al., "C60 Today: A Perspective View of Research on Carbon Fullerenes," *OCPA Newsletter*, pp. 9–11, Oct. 15, 1992.
"Fullerene–fluorine Bond Yields a Lubricant," *Chem. Eng.*, p. 19, Aug. 1991.

*Primary Examiner*—Paul Lieberman
*Assistant Examiner*—M. Kopec
*Attorney, Agent, or Firm*—Nixon, Hargrave, Devans & Doyle

[57] ABSTRACT

A superconductive fullerene and a process for making such superconductive fullerene are provided. The process involves contacting a quantity of fullerene with the vapor of an interhalogen compound such as ICl. The halogen doped fullerenes exhibited a transition temperature above 60 K.

10 Claims, 4 Drawing Sheets

INTER-HALOGEN-DOPED SUPERCONDUCTIVE FULLERENES

This is a division of application Ser. No. 08/008,213 filed on Jan. 25, 1993 now U.S. Pat. No. 5,380,703.

FIELD OF THE INVENTION

This invention relates to superconductive materials, and in particular to halogen doped fullerene superconductive materials and methods for making halogen doped fullerenes.

BACKGROUND OF THE INVENTION

In recent years superconductor materials have been the subject of increasing interest and research. Although relatively high superconducting transition temperatures (above 23 K) have been achieved using some oxide materials, such materials are often extremely complex and expensive to produce. It would therefore be desirable to develop alternative superconductive materials, which preferably are less complex and less expensive to make.

Carbon fullerenes (hereinafter referred to as "fullerenes"), sometimes referred to as buckyballs or buckminsterfullerenes, are a relatively newly discovered class of molecular materials. The most commonly discussed fullerenes are $C_{60}$ and $C_{70}$. A $C_{60}$ fullerene molecule consists of 60 carbon atoms joined together to form a cage structure with 20 hexagonal and 12 pentagonal faces symmetrically arrayed in a soccer ball-like structure. $C_{60}$ molecules form a close-packed solid molecular material having a face-centered cubic structure. The structure of $C_{70}$ has 25 hexagons, resulting in a shape reminiscent of a rugby ball.

Various attempts have previously been made to produce superconductive fullerene materials. For example, "Conducting Films of $C_{60}$ and $C_{70}$ by Alkali-Metal Doping" by Haddon et al., *Nature*, Vol. 350, No. 6316, pp. 320–322 (March, 1991), discloses alkali-metal doped $C_{60}$ films which are superconductive.

"Superconductivity in Doped Fullerenes", by Hebard, *Physics Today*, November, 1992, pages 26–32, discusses physical properties and theoretical mechanisms of superconductivity in alkali-metal doped $C_{60}$ fullerene molecules, and states that the maximum $T_c$ obtained was 33 K for $RbCs_2C_{60}$.

"Fullerenes", by Curl et al., *Scientific American*, October, 1991, pages 54–63, discloses $C_{60}$ fullerene molecules and teaches that, when doped with potassium or rubidium, fullerene molecules become superconductive. When i rubidium is used, for example, the critical temperature for superconductivity was found to be near 30 K.

"Solid $C_{60}$" by Huffman, *Physics Today*, November, 1992, pp. 22–29, discusses methods for doping $C_{60}$ with alkali-metal ions and thallium, and reports that the highest $T_c$ obtained was 42.5 K for $C_{60}$ with rubidium-thallium doping.

Unfortunately, due to the extreme sensitivity of alkali metal-containing materials to oxidation, alkali-metal-doped fullerenes are very unstable in air. Consequently, these materials are very difficult to work with, and lose their superconductive properties within minutes of being exposed to oxygen. It would, therefore, be desirable to find alternative methods and materials for doping fullerenes.

"Fluorination of Buckminsterfullerene" by Holloway et al., *J. Chem. Soc., Chem. Commun.*, pages 966–969 (1991) discloses contacting solid $C_{60}$ with fluorine gas to produce $C_{60}F_{60}$. However, this material is touted for its possible lubricating properties, and there is no mention or suggestion of this material being superconductive.

"Intercalation of Solid $C_{60}$ with Iodine", by Zhu et al., *Nature*, Volume 355, page 712–714 (Feb. 20, 1992), discloses the doping of solid $C_{60}$ with iodine to produce $C_{60}I_4$, and states that there is no superconductivity observed in this material down to 4 K.

There is generally an ever present need for alternative superconductive materials, particularly those which show promise for exhibiting high (i.e., above 23 K) superconductive transition temperatures. As for fullerene based superconductive materials, the need for higher superconductive transition temperatures remains.

SUMMARY OF THE INVENTION

In the method of the present invention, superconductive fullerene is produced by vaporizing a quantity of an interhalogen compound, such as liquid ICl, and contacting the vapor of said interhalogen compound with a quantity of fullerene material. When ICl is used for the interhalogen compound, the result of the process is that fullerene is produced which has been doped with at least one of either I or Cl in an amount sufficient to result in a superconducting transition temperature above about 10 K, more preferably above about 30 K, and most preferably above about 60 K.

The doped fullerene molecular solids of the present invention exhibit Meissner effect behavior and a superconductive transition temperature above about 10 K, more preferably above about 30 K, and most preferably above about 60 K.

DETAILED DESCRIPTION OF THE INVENTION

Figure 1:
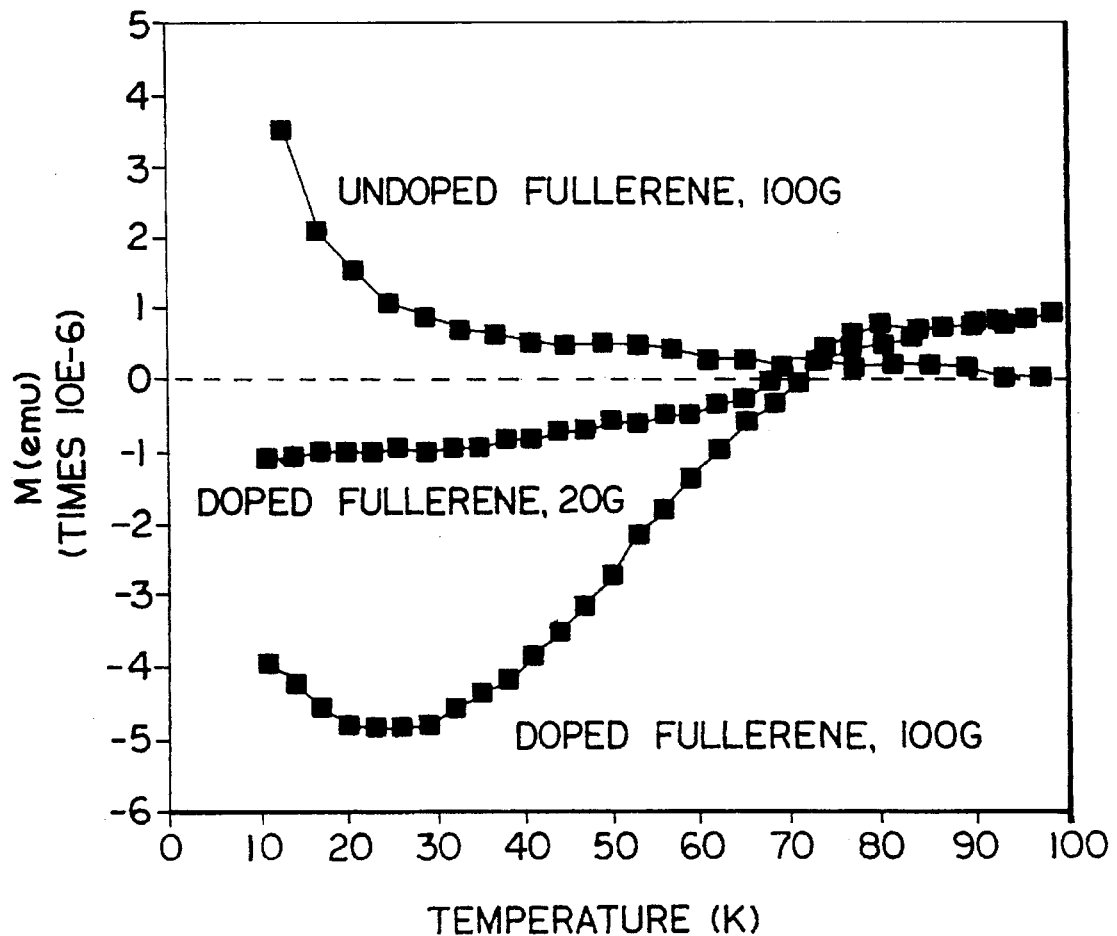
FIG. 1 compares the magnetization vs. temperature relationships of undoped fullerenes with the doped fullerenes of the present invention under zero-field-cooled conditions.

The present invention relates to halogen doped fullerene superconductive materials and methods for making halogen doped fullerenes.

The method of the invention involves contacting the fullerene material with a quantity of interhalogen compound under conditions sufficient to result in doping of the fullerenes with at least one of the elements of the interhalogen compound.

Preferred fullerene materials include $C_{60}$ and $C_{70}$, although other "higher fullerenes" such as $C_{76}$, $C_{78}$, $C_{84}$, $C_{92}$, and so forth, or a mixture of these materials could conceivably be employed.

The interhalogen compound is preferably selected from the group consisting of ICl, IBr, and other stable interhalogen molecules. An interhalogen molecule is one which contains two halogen elements bonded together.

In a preferred embodiment, the interhalogen compound is vaporized and the vapor of the interhalogen compound is contacted With the fullerene material, thereby doping the fullerene material. However, the method of doping is not limited, and other methods, such as sputtering or laser ablation, could be used to achieve doping.

In the method in which the interhalogen compound is vaporized prior to contact with the fullerene material, the interhalogen material is kept at room temperature or above so that the vapor pressure of the interhalogen is sufficient to result in halogen-doping of the fullerenes.

A particularly preferred interhalogen compound is iodine chloride, ICl. Although ICl is a solid at room temperature, heating to about 30° C. will convert the ICl to a liquid. By maintaining the ICl and fullerenes in a closed atmosphere at room temperature for a prolonged period of time, e.g., 1 to 5 hours, a weight gain can be obtained in the fullerene material, indicating successful doping. Although the largest weight gains were obtained when the ICl was kept at room temperature, the results achieved using room temperature ICl were less consistent than those achieved using heated ICl and/or fullerene material.

In one embodiment of the invention, ICl is heated, for example to about 40°–60° C. The ICl vapor is then contacted with the fullerene material for a sufficient time to achieve doping of the fullerene with at least one of I and Cl. Preferably, in addition to heating the ICl, the fullerene material is also heated during the contact period. The weight gain results achieved using heated fullerene and heated ICl were more consistent than those using room temperature materials. In one embodiment of the invention, the fullerene material is heated to a temperature above that which the ICl is heated. This technique was found to yield very reproducible results. For example, in one preferred embodiment, the fullerenes are heated to about 60° C., while the ICl is heated to about 40° C.

However, it is not critical that either the fullerene solids or ICl be heated, since even at room temperature, weight gains were observed for the fullerene materials after exposure to the ICl vapor, indicating that doping of the fullerene was successfully achieved. However, successful results are also achieved by heating either or both of the fullerene material or the interhalogen compound. The fullerene material may be heated at least as high as 80° C., and the interhalogen material may be heated at least as high as 50° C.

ICl-doped fullerenes made using the method of the present invention exhibit superconductive critical temperatures as high as 60 to 70 K. At temperatures below the superconductive critical temperature, the doped fullerenes of the present invention exhibit diamagnetic behavior.

Diamagnetism is the ability of a material to repel an applied magnetic field. Diamagnetism is a necessary condition of superconductivity and thus can serve as an indication of superconductivity. The highest diamagnetic signals obtained, as measured by a superconducting quantum interference device (hereinafter referred to as SQUID), were for samples which had a weight-gain, due to exposure to the interhalogen gas, about 50 percent or higher than the original weight of the undoped fullerene powder. However, it should be noted that, because of the equipment used to perform the examples, there was in all likelihood a relatively large percentage of the powder in these samples that exhibited either more or less than the 50 percent weight gain.

The interhalogen doped fullerenes of the present invention also exhibit magnetic flux trapping, a well known effect which is indicative of superconducting materials.

The ICl-doped fullerene superconductors of the present invention are very stable in ambient air compared to alkali-metal doped fullerenes. Samples were handled in ambient atmosphere during analytical measurements, in contrast to alkali-metal-doped fullerenes which require encapsulation to avoid oxidation due to exposure to air. After the initial tests, samples can usually be kept in a dry nitrogen atmosphere, without detrimentally effecting superconductive properties.

Because the superconductors of the present invention are isotropic, relatively stable in air, and free from oxides and alkali-metals, they appear to be very attractive class of molecular solids for future material applications.

The invention may be more easily comprehended by reference to specific examples. It must be understood, however, that these examples are provided only for purposes of illustration, and that the invention may be practiced otherwise than as specifically illustrated without departing from its spirit and scope.

EXAMPLES

Example 1

A mixture of fullerene powders was obtained from Texas Fullerenes Corporation. This powder had a claimed content of greater than 60 percent $C_{60}$, the remainder being $C_{70}$ and/or a small fraction (about 1 percent) of higher fullerenes. The average particle size of this powder was 10 μm. Approximately 20 mg of this fullerene mixture was placed into an open, cylindrical glass vial (dimensions about 5 mm diameter, 30 mm long). Approximately 10–20 grams of ICl, obtained from Aldrich Chemical Co., was placed into another open cylindrical glass vial (dimensions about 13 mm diameter×25 mm long). The ICl containing vial was placed next to the vial containing the fullerene powder, and both vials were covered by a larger cylindrical glass enclosure (dimensions about 25 mm diameter×75 mm long) so that the two vials were essentially contained within a closed atmosphere. The vials were allowed to sit within the enclosed atmosphere for a period of about 1–5 hours, as indicated in Table 1 below. After exposure to the ICl vapor, the fullerene powder was again weighed. The resultant weight gain is indicated in Table 1.

TABLE 1

| Sample # | Temperature (°C.) | Time (hours) | Weight Gain (%) |
| --- | --- | --- | --- |
| 1 | 20 | 1 | 38 |
| 2 | 20 | 3 | 50 |
| 3 | 20 | 5 | 56.5 |

Note that weight gain was proportional to exposure time. However since it is unlikely that the system came close to reaching an equilibrium condition, there was in all likelihood a large percentage of the exposed fullerene powder which exhibited weight gains both higher and lower than the results indicate. The saturation level of halogen doping in the fullerene material is a function of many variables, such as the interhalogen vapor pressure, exposure time particle size, and so forth. Consequently, it is believed that more complete reactions could be achieved by improving the process by which the fullerenes are doped, such as, for example, by increasing the exposure time or taking measures to provide for more uniform exposure of the fullerene to the ICl vapor.

Example 2

The method described in Example 1 was repeated, with the exception that the vials containing the fullerene material and interhalogen material were placed in an inverted cone-shaped flask about 150 mm high, having approximately a 100 mm diameter base and narrowing to an open top having an approximately 25 mm diameter. A fullerene containing vial (12 mm diameter×5 mm height) was placed on the bottom of the flask. The ICl-containing vial (dimensions about 13 mm diameter×25 mm long) was hung inside and near the top of the flask. The flask was then placed on a hot plate and heated, while simultaneously the top of the flask was heated using a resistance type heating coil wrapped around the outside of the top of the flask. The temperature of the fullerenes was consequently close to that of the hot plate. The temperature of the ICl containing vial was monitored using a thermocouple. Using this setup, the ICl was heated to about 40° C., while the fullerene powders were heated to about 60° C. The increase in temperature resulted in an increase in pressure inside the enclosure of about 1–2 psi. The reaction time was varied from two to five days. The results are indicated in Table 2 below.

TABLE 2

| Sample # | Temperature (°C.) Fullerenes | Temperature (°C.) ICl | Time (Days) | Weight Gain (%) |
| --- | --- | --- | --- | --- |
| 4 | 60 | 40 | 2 | 43 |
| 5 | 60 | 40 | 3 | 53 |
| 6 | 60 | 40 | 5 | 51 |

The weight gains observed in Samples 1 through 6 indicate that doping of the fullerenes was successful.

To illustrate the superconductive behavior of the above Examples, Sample 3 from Example 1 was mounted in a gelatin capsule and placed in a SQUID magnetometer (Model MPMS, manufactured by Quantum-Design). The background noise level of this magnetometer was consistently found to be lower than $0.5\times10^{-6}$ emu at 100 G. The magnetization of each sample was measured (zero-field-cooled mode) as the temperature was raised from 10 K to 100 K. The resultant magnetization vs. temperature relationship for Sample No. 3 is illustrated in FIG. 1 (note that the applied magnetic field was varied between 20 and 100 G). For comparative purposes, the magnetization curve for undoped fullerene is also illustrated. Note that the undoped fullerene powders show weak paramagnetism and that the magnetization (about $2-3\times10^{-6}$ emu in a field of 100 G at 10 K) follows Curie law behavior up to a temperature around 30 K, at which point it becomes difficult to distinguish the paramagnetic signal from the background noise.

In contrast to the undoped mixture, note that the ICl-doped fullerene (Sample 3) exhibit diamagnetic behavior (Meissner effect) at temperatures below the critical temperature $T_c$, which occurs at somewhere between 60 and 70 K. The negative magnetization (diamagnetic) signal was always 4–10 times larger than the background and was consistently linearly proportional to the applied magnetic field. The slight decrease in magnetization illustrated between 10 and 20 K in FIG. 1 is believed to be due to the presence of undoped fullerene powders in the specimen. The net magnetization illustrated is thus believed to be due to the combination of a diamagnetic contribution from the ICl-doped fullerenes and a paramagnetic contribution from the undoped fullerenes. Note that above 20 K, the magnetization exhibits the temperature dependence typical of a superconductor, and that the superconductive transition temperature appears to be somewhere above 60 K, possibly higher than 70 K.

The doped fullerenes which seemed to exhibit the best results were those which had experienced at least about a 50 percent weight gain. Such powders consistently were found to yield reproducible Meissner effect behavior similar to that illustrated in FIG. 1 for Sample 3.

Example 3

The method described in Example 1 was repeated, with the exception that the temperature of the cylindrical enclosure was kept at about 18° C. for about 15 hours. This resulted in a weight gain in the fullerene powder of about 57 percent.

Figure 2:
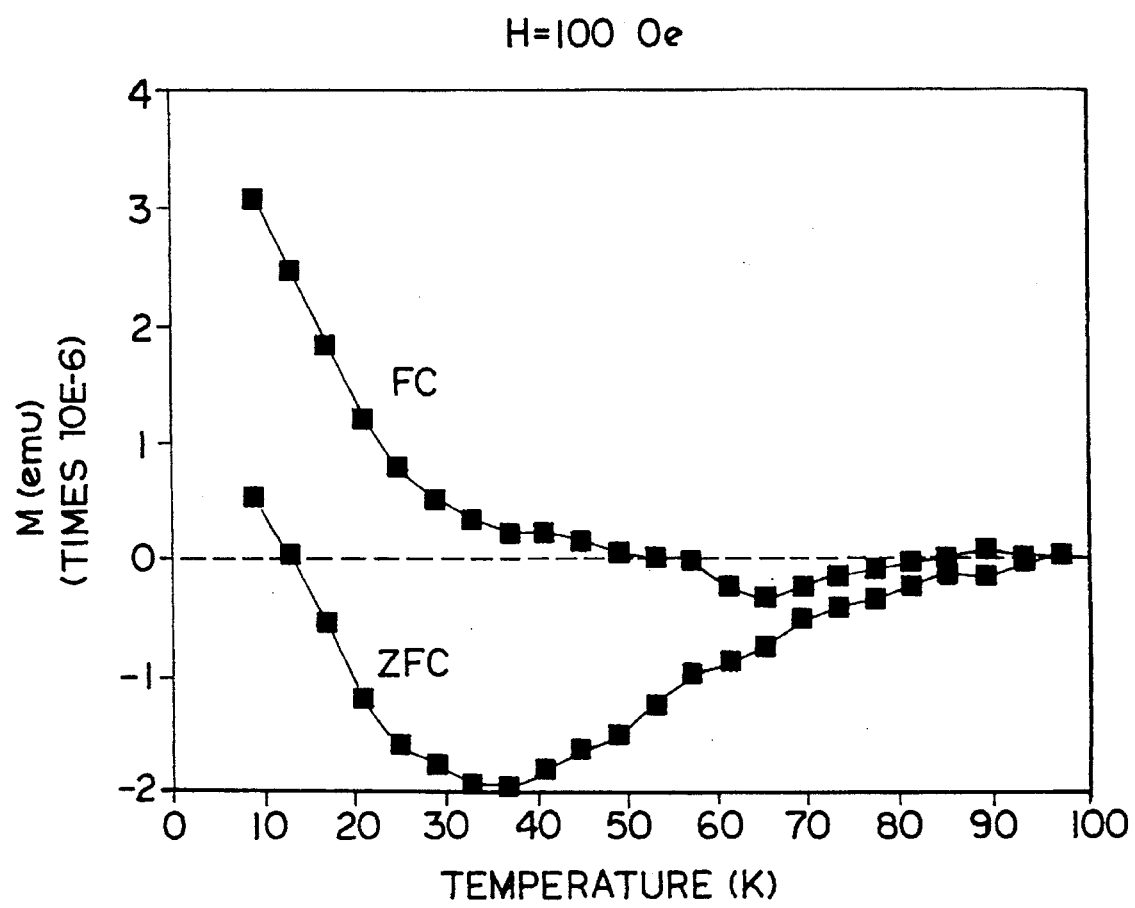
FIG. 2 illustrates magnetization curves for zero-field-cooled and field-cooled ICl-treated fullerenes.

SQUID magnetization measurements were conducted using the sample produced in Example 3, using both a zero-field-cooled (ZFC) and field-cooled (FC) mode using a probing field of 100 G. In field-cooled analyses, a magnetic field is applied to the sample before it is cooled. Then, once the sample has been cooled to its lowest temperature, the magnetization of the sample is measured while the temperature of the sample is raised (in this case from 10 to 100 K). Conversely, under zero-field-cooled conditions, no magnetic field is applied prior to cooling. Consequently, magnetic field trapping is not possible. Under zero-field-cooled conditions, once the sample has been cooled to its lowest temperature, the magnetic field is applied, after which magnetization of the sample is measured as the temperature is raised. The results of the magnetization measurements performed on the sample produced in Example 3 are illustrated in FIG. 2. The initial and parallel drop seen in both the ZFC and FC curves below 30 K is believed to be caused by the paramagnetic contributions of undoped fullerenes present in the resultant mixture. The constant difference between the ZFC and FC curves at low temperatures illustrates the well known magnetic flux trapping effect which is representative of superconducting materials, and further illustrates the presence of superconductive components in the resultant material. If the paramagnetic portion is subtracted out, these curves exhibit the typical behavior of a superconductor with incomplete Meissner effect similar to those found in many of the well known high-$T_c$ oxide superconductors.

The temperature-dependence of diamagnetism and the effect of magnetic flux trapping illustrated in FIGS. 1 and 2, are unequivocal earmark evidences (Meissner effect) commonly used to identify superconductivity. Due to the relatively small magnitude of measured negative magnetism it is believed that the volume fraction of the superconducting component in these ICl-doped fullerenes was relatively small. However, the evidence of high temperature superconductivity ($T_c>60$ K) is sufficient to conclude that interhalogen-doped fullerenes can indeed reach a value of $T_c$ comparable to that of many oxide superconductors. Using the present method of ICl-doping, the maximum diamagnetic susceptibility obtained so far was about $-5.0\times10^{-6}$ emu, which is about a factor of hundred smaller than that found in alkali-metal-doped fullerenes. It is believed that this is due to the small volume fraction of superconducting components being present.

Figure 3:
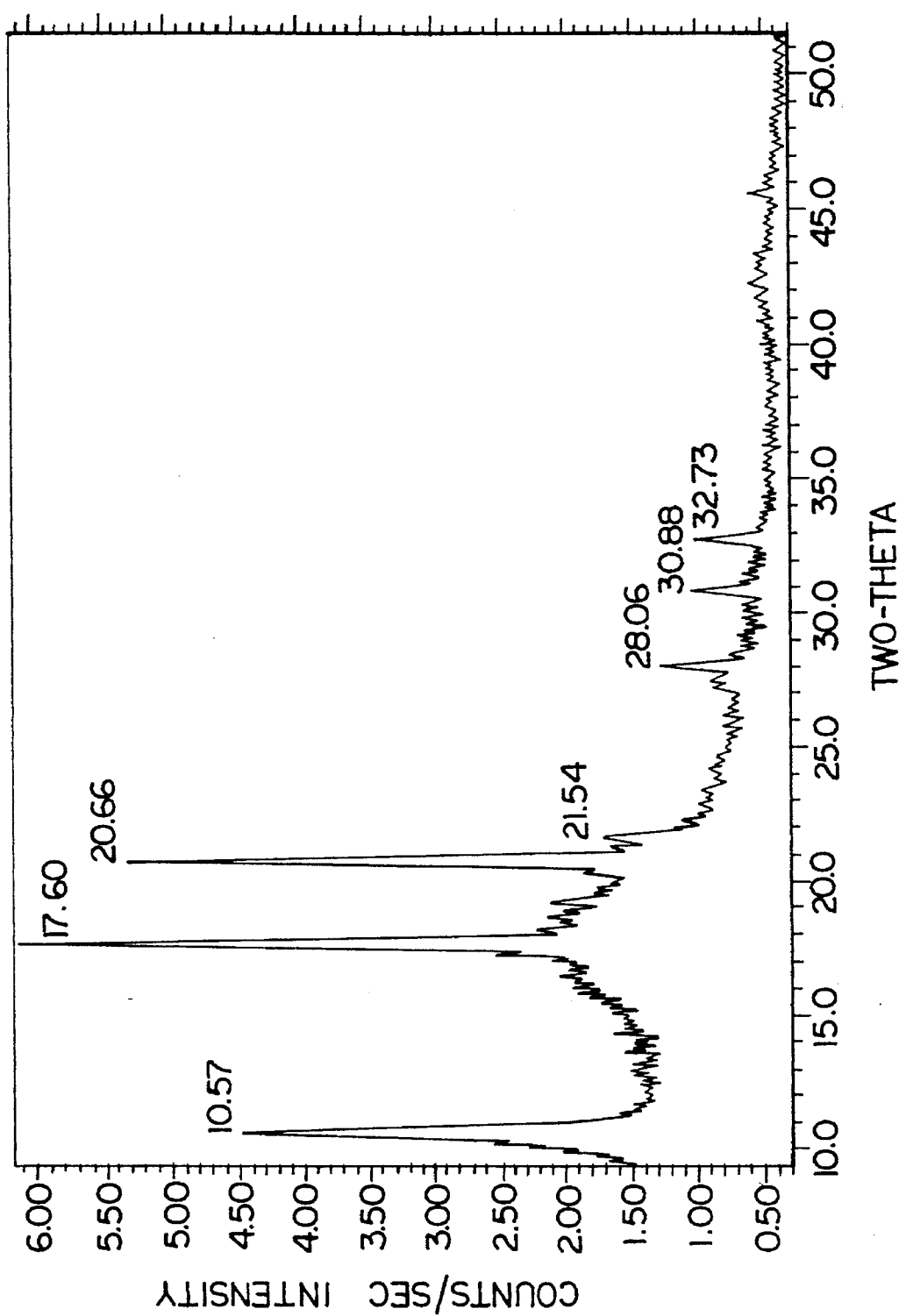
FIG. 3 is X-ray diffraction data for untreated fullerene molecular solids.
Figure 4:
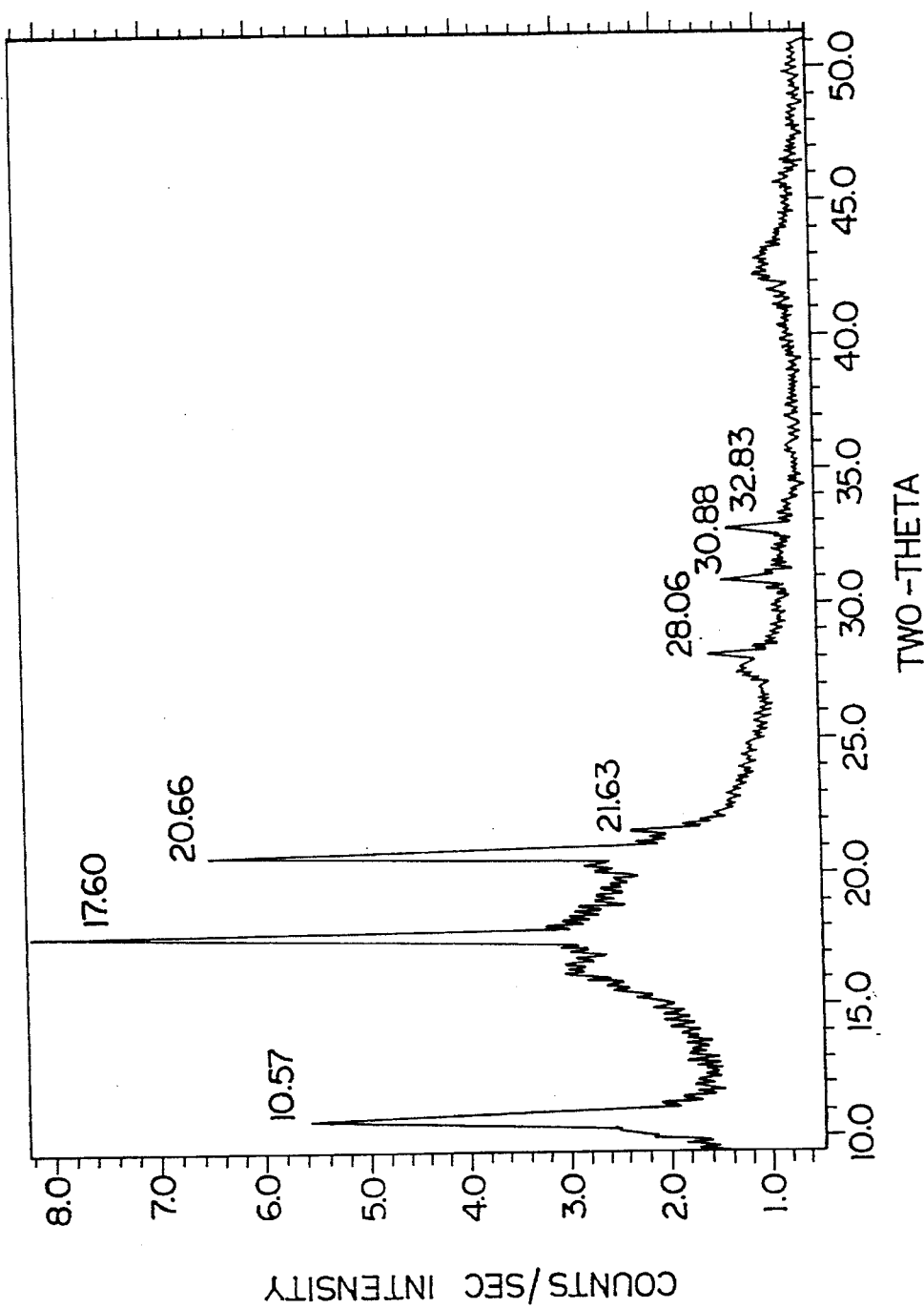
FIG. 4 is X-ray diffraction data for fullerenes which have been treated with ICl in accordance with the present invention.

X-ray powder diffraction measurements are illustrated for undoped fullerenes, in FIG. 3, and ICl-doped fullerenes, in FIG. 4. Comparison of the doped and undoped fullerenes reveal no apparent structural changes. Although small changes in diffraction peak intensity occurred, no shift in peak position was detected, indicating that the structure of the fullerene molecular solid material remained face-centered-cubic.

To determine the stability of the doped fullerenes, Sample No. 13 from Example 1 was subjected to magnetization tests at various time intervals. In SQUID measurements taken four days after the initial study, both the diamagnetic and flux trapping signals remained unchanged. Three weeks thereafter, the signals started to deteriorate, and finally, 45 days later, these signals had completely disappeared, and the material had turned paramagnetic, like the undoped fullerenes.

The invention has been described in detail with reference to preferred embodiments thereof, but it will be understood that variations and modifications can be effected within the scope of the invention.

What is claimed is:

1. A superconductive material comprising:
    fullerene doped with an interhalogen material in a quantity sufficient to result in a superconducting transition temperature above about 10 K.

2. A superconducting material according to claim 1, wherein said superconducting transition temperature is above about 30 K.

3. A superconducting material according to claim 1, wherein said superconducting transition temperature is above about 60 K.

4. A superconducting material according to claim 1, wherein said fullerene material is selected form the group consisting of $C_{60}$, $C_{70}$, other higher fullerenes, or mixtures thereof.

5. A superconductive material prepared by a process comprising:
    contacting vaporized interhalogen material with a quantity of fullerene to form a fullerene doped with an interhalogen material and having superconductive properties.

6. A superconductive material prepared by a process comprising:
    heating a quantity of an interhalogen material to form a vaporized interhalogen material; and
    contacting said vaporized interhalogen material with a quantity of fullerene to form a fullerene doped with an interhalogen material and having superconductive properties.

7. A superconducting material according to claim 5, wherein said contacting occurs for a period of time sufficient to result in a transition temperature for said superconducting material above about 10 K.

8. A superconducting material according to claim 5, wherein said contacting occurs for a period of time sufficient to result in a transition temperature for said superconducting material above about 30 K.

9. A superconducting material according to claim 5, wherein said contacting occurs for a period of time sufficient to result in a transition temperature for said superconducting material above about 60 K.

10. The superconductive material of claim 6, wherein said interhalogen material is ICl.

* * * * *